United States Patent
Ganzelmi et al.

(12) 
(10) Patent No.: US 6,373,288 B1
(45) Date of Patent: *Apr. 16, 2002

(54) METHOD OF IMPLEMENTING CLOCK TREES IN SYNCHRONOUS DIGITAL ELECTRONIC CIRCUITS, AND A PROGRAMMABLE DELAY BUFFER STAGE THEREFOR

(75) Inventors: Roberto Ganzelmi, Vittuone; Cesare Pozzi, Capriate; Alberto Battaia, Ispra, all of (IT)

(73) Assignee: STMicroelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/096,919

(22) Filed: Jun. 12, 1998

(30) Foreign Application Priority Data

Jun. 20, 1997 (IT) .......................................... MI97A1471

(51) Int. Cl.[7] .............................................. H03K 19/00
(52) U.S. Cl. ............................. 326/93; 326/101; 326/37
(58) Field of Search .............................. 326/82, 93, 37, 326/101; 327/276–278

(56) References Cited

U.S. PATENT DOCUMENTS 5,376,842 A * 12/1994 Honoa et al. .................. 326/21
5,831,459 A * 11/1998 McDonald .................. 327/141

* cited by examiner

Primary Examiner—Michael Tokar
Assistant Examiner—Anh Q. Tran
(74) Attorney, Agent, or Firm—Lisa K. Jorgenson; Allen, Dyer, Dopplet, Milbrath & Gilchrist, P.A.

(57) ABSTRACT

A method is for implementing at least one clock tree in a synchronous digital electronic circuit. The method may include selecting an interchangeable programmable delay buffer stage, calculating an expected skew based upon the selected interchangeable programmable delay buffer stage, and interchanging the selected interchangeable programmable delay buffer stage with another if the expected skew is different from a desired skew. A related synchronous digital electronic circuit includes a plurality of clock trees, and an interchangable programmable delay buffer stage connected to each of the clock trees.

12 Claims, 7 Drawing Sheets

METHOD OF IMPLEMENTING CLOCK TREES IN SYNCHRONOUS DIGITAL ELECTRONIC CIRCUITS, AND A PROGRAMMABLE DELAY BUFFER STAGE THEREFOR

FIELD OF THE INVENTION

This invention relates to digital electronics, and, more particularly, to a method of implementing clock trees in synchronous digital electronic circuits, and to a programmable delay buffer stage therefor.

BACKGROUND OF THE INVENTION

As will be readily appreciated by one skilled in the art, one of the most exacting problems associated with making synchronous digital electronic circuits is the making of the so-called clocking or clock trees therein. A clock tree is a circuit portion designed to provide full synchronization for the operations of different sub-circuits included in a complex circuit system, such as a semiconductor integrated circuit.

The problems connected with the implementation of clock trees are reviewed, for example, in an article "Post-processing of Clock Trees via Wiresizing and Buffering for Robust Design", IEEE Transactions on Computer Aided Design of Integrated Circuits and Systems, Vol. 15, No. 6, June 1996. One typical problem to be addressed in designing clock trees is the delay time that hampers the clock signal through the various interconnection nodes between circuit portions of the system. In fact, there is a demand for minimizing the relative delay or "skew" of a clock signal being propagated through the various interconnection nodes of an electronic circuit where the signal is utilized.

The delay in propagating the clock signal along the circuit is tied to the capacitive load present on the various circuit branches. This capacitive load is, in turn, dependent on the ultimate construction of the integrated electronic circuit. Since at the designing stage of the clock tree the ultimate construction of the integrated circuit may still be unresolved as to details, the clock tree is usually sized on the basis of assumptions about the complexity of the finished circuit. Later on, once the overall construction of the integrated circuit is more complete or settled, the clock tree will be altered to adapt it to that construction.

This clock tree designing procedure implies some clear drawbacks arising since the circuit structures appointed to propagate the clock signal cannot be defined at an early stage of the designing procedure, and that subsequent processing is expensive and time consuming. Another drawback is that it is not always possible to adopt a common approach to the design of either a standard type of circuit structure using a CAD design assisting apparatus (standard cell), or a substantially manually designed (full custom) circuit.

Some attempted approaches to the implementation of clock trees in synchronous digital electronic circuits have been proposed in the prior art. A first approach is described in a paper "Clock Tree Synthesis Methodology" presented at the International Cadence Users Group Conference held in Boston in October 1985. A second prior approach is described in an article "Design Methodology for Synthesizing Clock Distribution Networks Exploiting Nonzero Localized Clock Skew", IEEE Transactions on "Very Large Scale Integration (VLSI) Systems", Vol. 4, No. 2, June 1996.

SUMMARY OF THE INVENTION

The present invention is aimed at improving on the methodologies disclosed in the above references. In particular, the present invention provides a method for forming clock trees in synchronous digital electronic circuits, and a programmable delay buffer stage therefor, which have functional and structural features to ensure adequate attenuation of the propagation skew and lower processing costs for the clock tree.

One aspect of the present invention uses a programmable delay buffer stage to provide clock trees with a desired predetermined amount of skew. Based on this principle, the shortcomings of the prior art are overcome by a method as previously indicated being characterized in that it provides for the use of buffer stages having a programmable delay.

The present invention also preferably provides a programmable delay buffer stage comprising at least one input terminal and at least one output terminal, and a plurality of inverters connected in series and/or parallel with one another between the input terminal and the output terminal to produce a desired predetermined amount of skew.

BRIEF DESCRIPTION OF THE DRAWINGS

The features and advantages of a method and a buffer stage according to this invention will be more clearly understood from the following description of embodiments thereof, given by way of non-limitative examples with reference to the accompanying drawings. In the drawings.

DETAILED DESCRIPTION OF THE PREFERRED EMBODIMENTS

Figure 1:
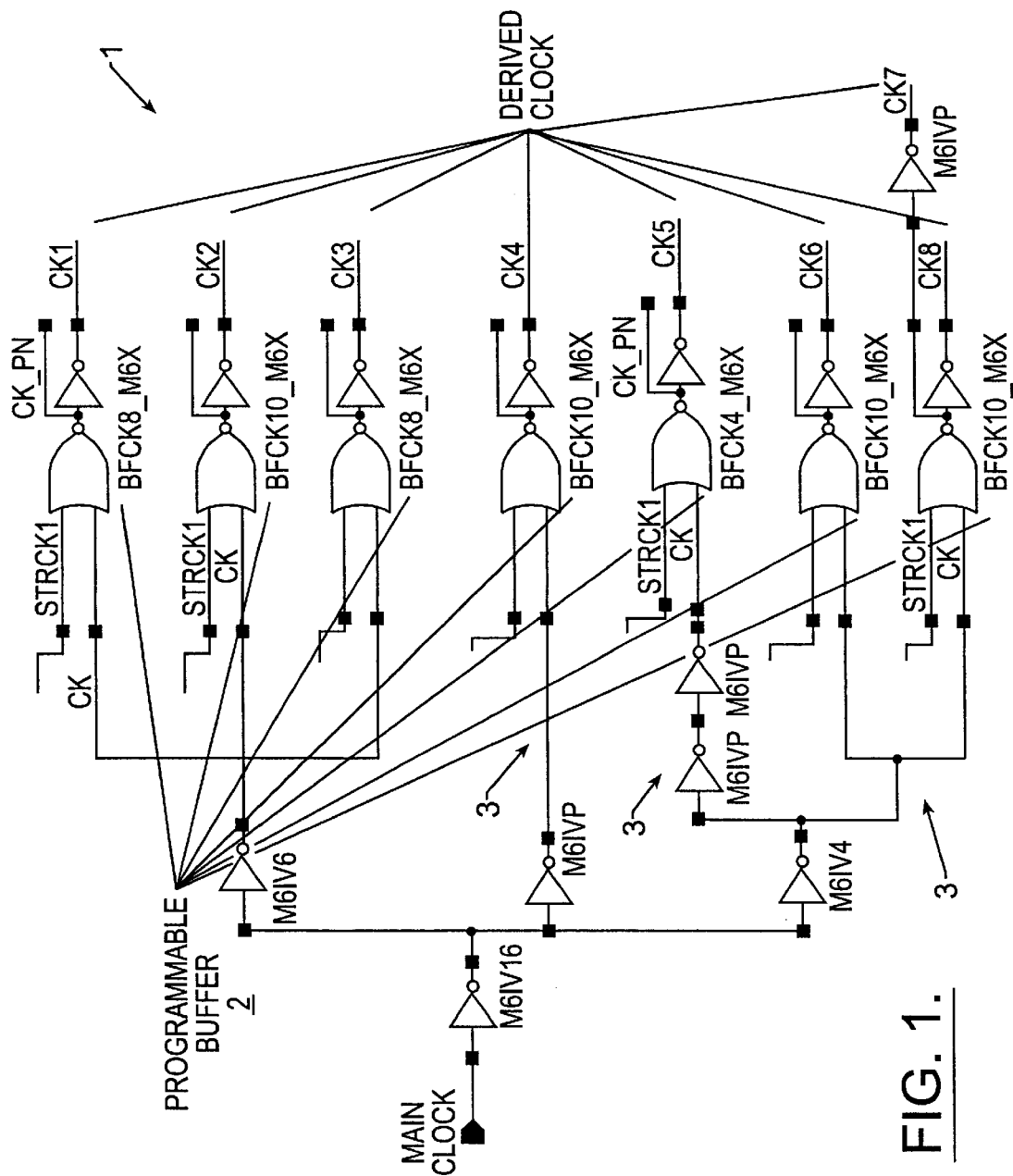
FIG. 1 is a diagrammatic representation of a clock tree having a plurality of branches to which the method of this invention can be applied.

Referring to the drawing figures, generally and schematically shown at 1 is a clock tree for synchronous digital electronic circuits. The tree 1 comprises a plurality of branches 3, each adapted, in accordance with this invention, to include a programmable delay type of buffer stage 2.

Figure 2:
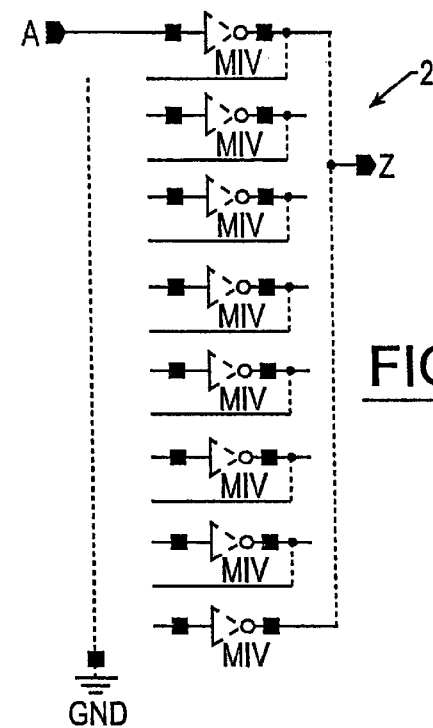
FIGS. 2, 2A and 3 show respective diagrams of exemplary construction and program implementations of a programmable delay buffer incorporated into the clock tree of FIG. 1.

More particularly, the stage 2 shown in FIG. 2 comprises an input terminal A, an output terminal Z, and a plurality of inverters MIV. The inverters MIV are all connected together in parallel between the two input and output terminals A and Z. Alternatively, the connections between such inverters could be altered to have all the inverters connected in series with one another. It will be further appreciated that some of the inverters could be connected in series, and others connected in parallel. In this way, the tree 1 can be implemented to a have a desired predetermined amount of skew.

Figure 2A:
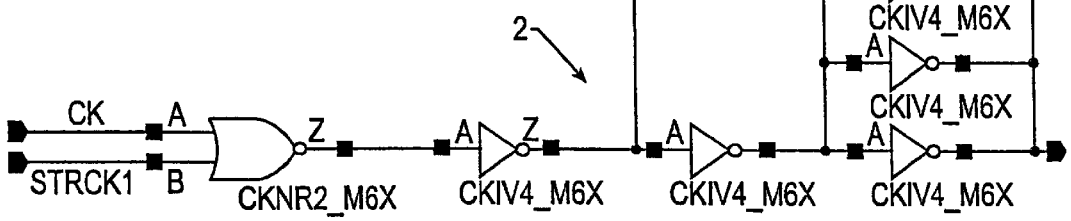
Figure 3:
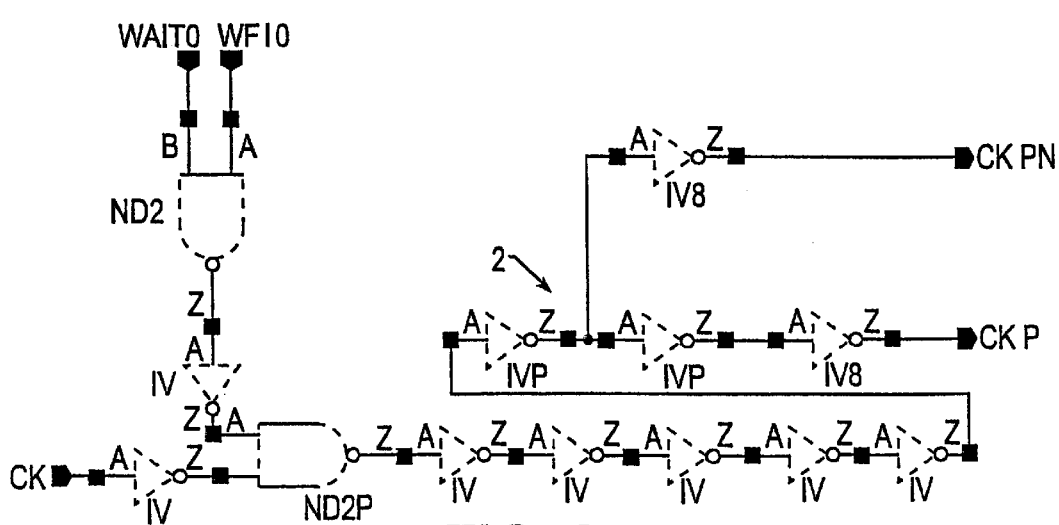
Figure 4:
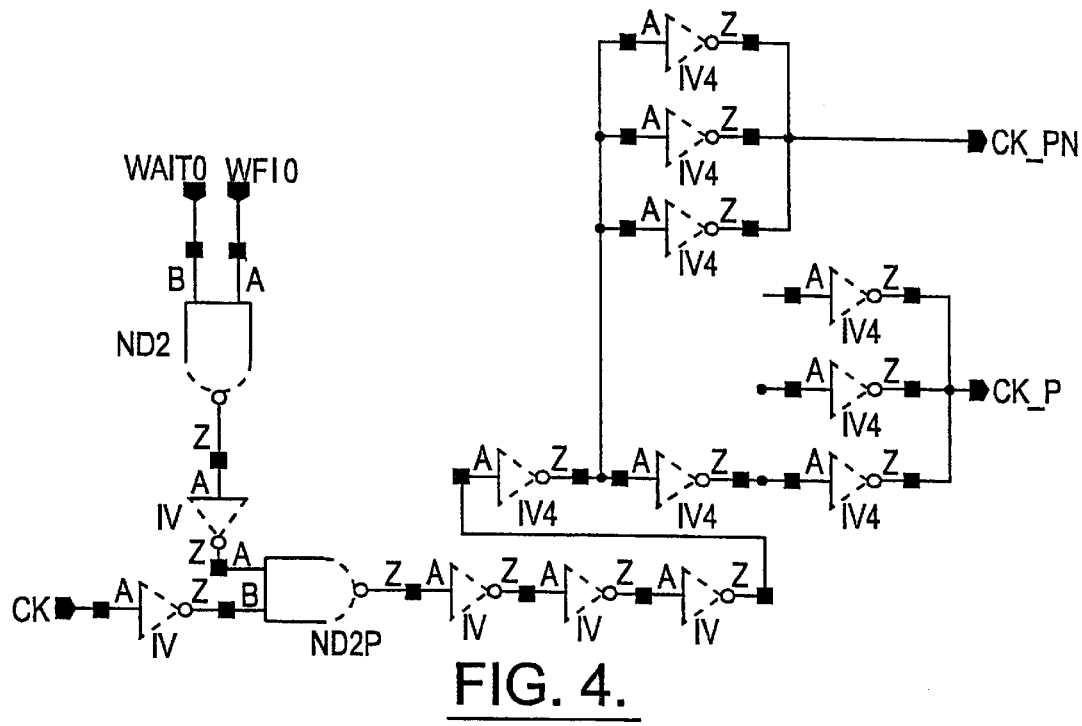
FIGS. 4 and 5 show respective schematics of modified implementations of CAD programming for the buffers in FIGS. 2 and 3.
Figure 5:
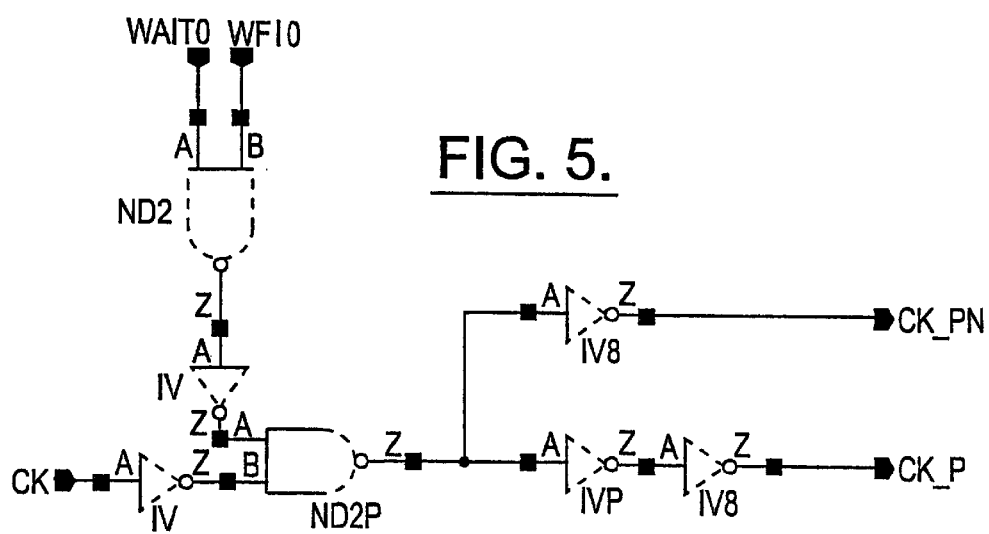

FIGS. 2 and 2A show respectively possible construction and program modifications of the buffer stage 2. FIGS. 3, 4 and 5 show respectively further variations of a programmable stage 2 for incorporation, in accordance with this invention, into a clock tree.

Shown in FIG. 3 is an exemplary layout of a buffer stage having three input terminals and two output terminals. The three input terminals are respectively applied signals WAIT0, WFI0 and CK. The first two of these signals are applied to the respective inputs of a two-input logic NAND gate designated by the reference ND2. The output of the gate ND2 is connected, via an inverter I2, to one input of a second two-input logic NAND gate designated by the reference ND2P. The other input of the second logic gate receives the signal CK through an inverter IV.

The output of the second logic gate ND2P is connected to one of the output terminals of the clock tree via a series of inverters. A connection to the other output terminal of the clock tree is derived from this series of inverters with the interposition of yet another inverter.

Figure 6:
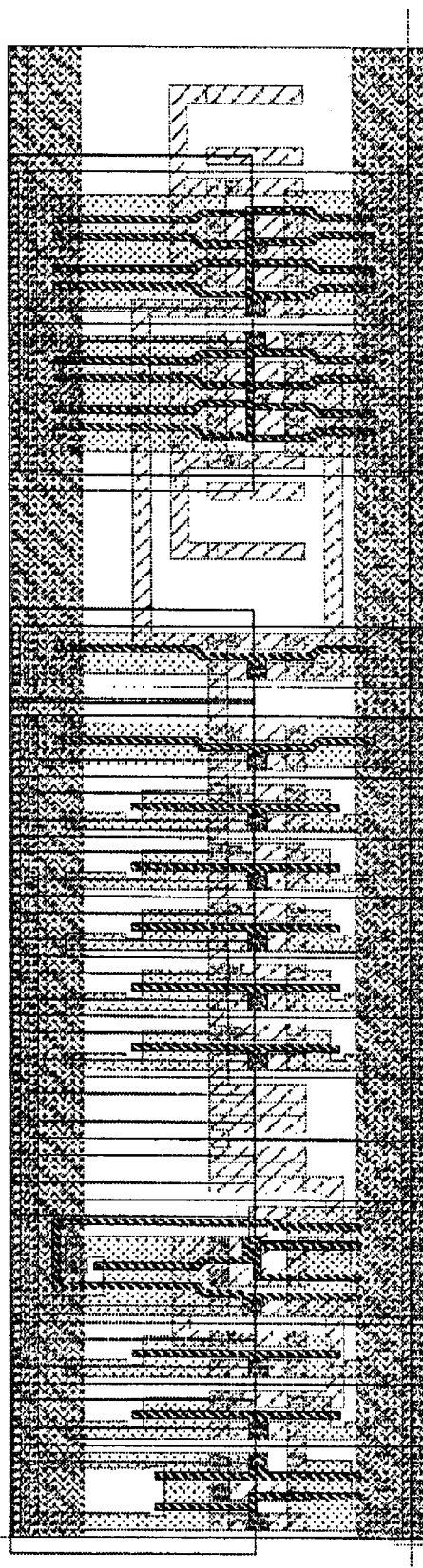
FIGS. 6, 7 and 8 are respective top plan views showing, schematically to an enlarged scale, portions of a semiconductor integrated circuit corresponding to the layouts of the buffers in FIGS. 3, 4 and 5.

FIG. 6 shows the circuit layout corresponding to the schematic of FIG. 3. In FIGS. 4 and 5 there are shown schematics of buffer stages 2 which are basically similar to the example of FIG. 3, but differ from it by the number of inverters provided between the output of the second logic gate ND2P and the output terminals, and the way such inverters are connected. In fact, it can be noticed from FIG. 4 that the series of output inverters is interrupted by a set of three inverters connected in parallel. The branch to the second output terminal also includes a parallel connection of three inverters. In the example of FIG. 5, the branch to the second output terminal is instead provided directly downstream of the second logic gate ND2P.

Figure 7:
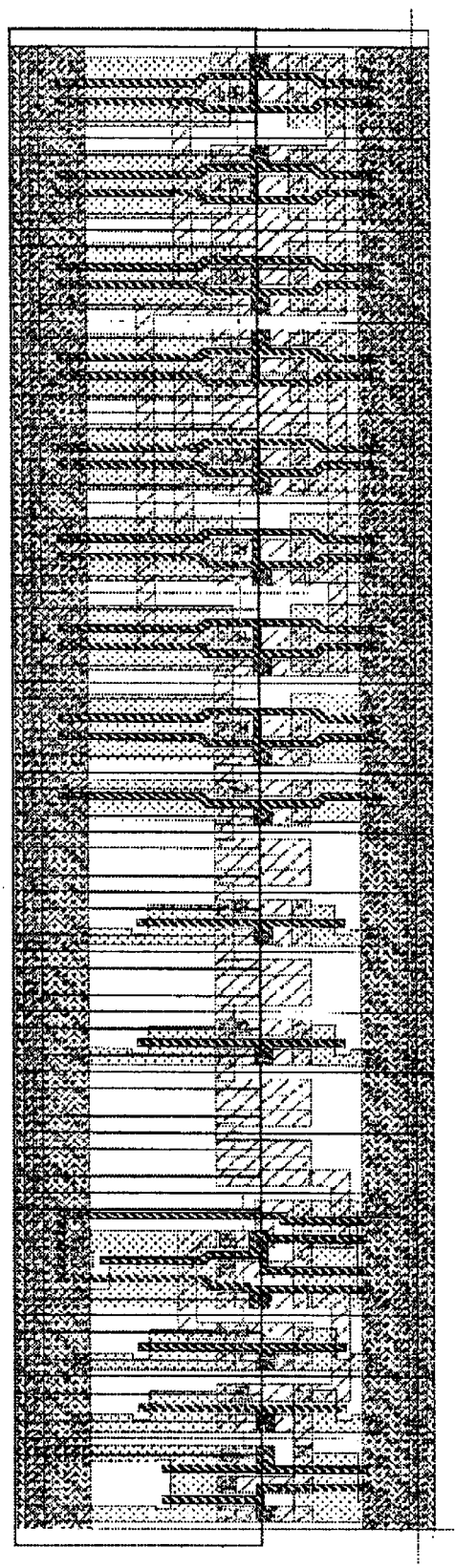
Figure 8:
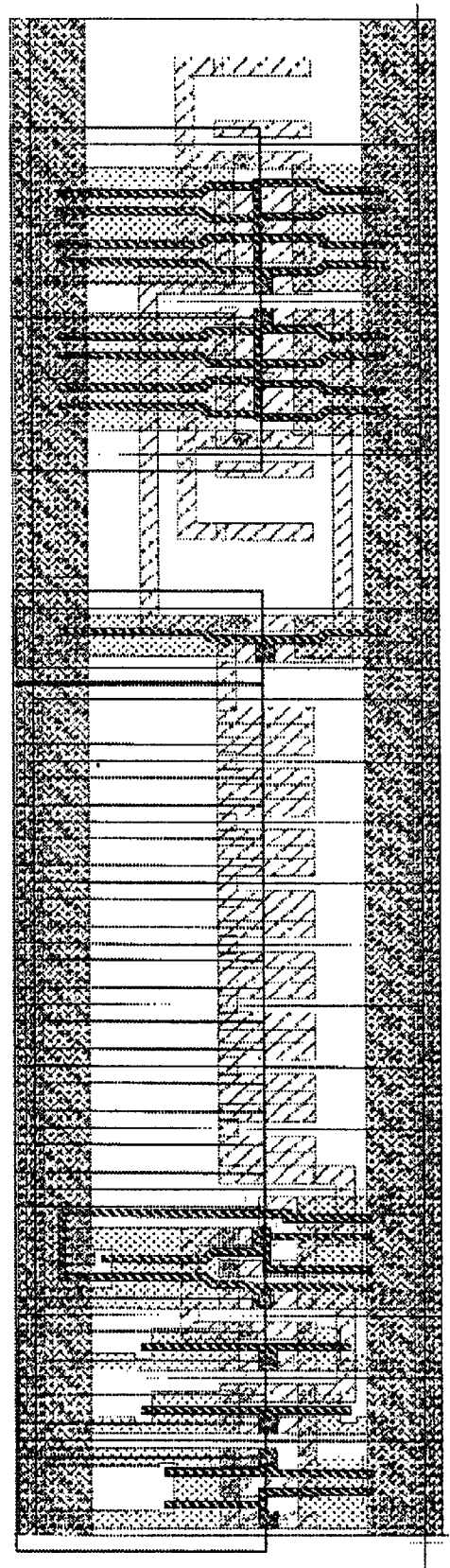

FIGS. 7 and 8 show respective circuit layouts corresponding to the schematics of FIGS. 4 and 5. The different layouts of the circuits merely reflect a different arrangement for certain metal lines. Thus, changing the arrangement of a few metal lines is all that is required to provide trees with a desired amount of skew.

It should be appreciated from these layouts that the circuits of FIGS. 3, 4 and 5 are identical as to space occupation and the placement of their input and output terminals. This points to the fact that, in a practical embodiment, it will be possible to replace the buffer stages in the finished layout without the latter having to be regenerated, even if the starting specifications are changed.

Figure 9:
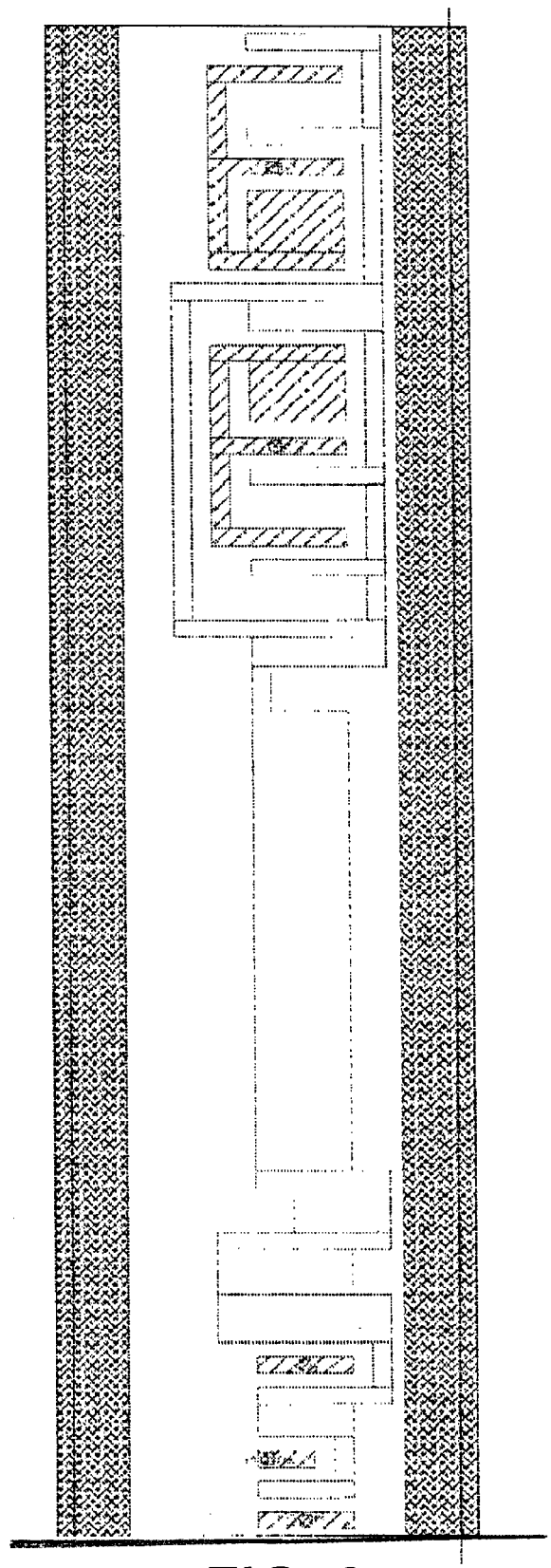
FIG. 9 is a top plan view showing, schematically to an enlarged scale, a portion of a semiconductor integrated circuit which represents a bare minimum of layout information required to generate the buffers in FIGS. 3, 4 and 5.

FIG. 9 is a schematic view of the main mapping or "abstract" of the layout of a programmable delay buffer stage 2 which is consistent with the modifications of FIGS. 3, 4 and 5. That is, this figure summarizes the common layout characteristics of the buffer stages 2 in FIGS. 3, 4 and 5, and highlights the fact that the different circuit designs shown in FIGS. 3, 4 and 5 are still identical as to space occupation and the locations of their input and output terminals.

The method of this invention comprises the following steps. A clock tree 1 is patterned and synthesized conventionally, using at least one programmable delay buffer stage 2. Specifically, a plurality of branches 3 of the tree 1 may be formed and programmed using a buffer stage 2 implemented according to any of the schematics shown in FIGS. 2, 2A, 4 and 5. What counts is that the same amount of skew be provided downstream of the clock tree 1. A circuit layout is then generated corresponding to the tree 1, such as by automated generation equipment of the CAD type.

All the values of the parasitic capacitances and resistances present in the resulting layout are then extracted therefrom. At this point, the clock tree is optimized by suitably programming the buffer stages to reduce the propagation skew. The circuit layout is finished based on the optimization step.

As can be appreciated from the foregoing description, the use of programmable delay buffers greatly simplifies the clock tree optimization step. A significant feature of the invention lies in the concept of employing a family of buffers, each having a predetermined input-output delay value, being dependent on the load, which buffers have the same physical dimensions, and which have their input and output terminals placed at exactly the same locations.

With a full custom type of methodology, merely by having a few metal lines arranged differently, the optimum configuration can be achieved while keeping the space requirements of the clock tree unchanged. With a place-and-route type of methodology, a buffer family should be used which have the same abstract and varying delay, such that the configuration of the clock tree can be altered by the mere replacement of cells in the finished layout.

That which is claimed is:

1. A method of implementing at least one clock tree in a synchronous digital electronic circuit, the method comprising:

selecting at least one interchangeable programmable delay buffer stage; and calculating an expected skew based upon the selected at least one interchangeable programmable delay buffer stage, and interchanging the selected at least one interchangeable programmable delay buffer stage with another if the expected skew is different from a desired skew.

2. A method according to claim 1, wherein said at least one programmable delay buffer stage comprises a plurality of programmable delay buffer stages; and wherein each programmable delay buffer stage has at least one input terminal and at least one output terminal, and comprises a plurality of inverters connected together in series and/or parallel between the input terminal and the output terminal to produce a desired predetermined amount of skew.

3. A method according to claim 2, further comprising providing at least one logic gate connected upstream of the plurality of inverters for each interchangeable programmable delay buffer stage.

4. A method according to claim 1, further comprising programming the delay by changing an arrangement of at least one metal line in a circuit layout of the at least one clock tree.

5. A method according to claim 1, wherein the at least one clock tree comprises a plurality of clock trees, and wherein circuit layouts of clock trees having different amounts of skew are identical as to space occupation and placement of input and output terminals.

6. A method of implementing a plurality of clock trees in a synchronous digital electronic circuit, the method comprising:

selecting a plurality of interchangeable programmable delay buffer stages, wherein each interchangeable programmable delay buffer stage has at least one input terminal and at least one output terminal, and comprises a plurality of inverters connected together between the input terminal and the output terminal to produce a desired skew; and calculating expected skews based upon the plurality of interchangeable programmable delay buffer stages, and interchanging any one of the plurality of interchangeable programmable delay buffer stages with another if the expected skew is different from a desired skew.

7. A method according to claim 6, further comprising providing at least one logic gate connected upstream of the plurality of inverters for each interchangeable programmable delay buffer stage.

8. A method according to claim 6, further comprising programming the delay by changing an arrangement of at least one metal line in a circuit layout of at least one clock tree.

9. A method according to claim 6, wherein circuit layouts of clock trees having different amounts of skew are identical as to space occupation and placement of input and output terminals.

10. A synchronous digital electronic circuit comprising:
   a plurality of clock trees; and
   at least one interchangable programmable delay buffer stage connected to each of said clock trees, each interchangable programmable delay buffer stage comprising
      at least one input terminal and at least one output terminal, and
      a plurality of inverters connected with one another between the input terminal and the output terminal to produce a desired skew,
         said at least one input terminal and said at least one output terminal and said plurality of inverters for each interchangeable programmable delay buffer stage having a same layout and space occupation for interchangeability.

11. A circuit according to claim 10, further comprising a plurality of logic gates connected upstream of the plurality of inverters for each interchangeable programmable delay buffer stage.

12. A circuit according to claim 10, wherein the delay is programmed by changing an arrangement of at least one metal line in a circuit layout of the at least one clock tree.

* * * * *